United States Patent [19]

Wilson et al.

[11] Patent Number: 5,712,635
[45] Date of Patent: Jan. 27, 1998

[54] DIGITAL TO ANALOG CONVERSION USING NONUNIFORM SAMPLE RATES

[76] Inventors: James Wilson, 295 S. Walpole St., Sharon, Mass. 02067; Ronald A. Cellini, 24 Wildwood Ave., Newton, Mass. 02160; James M. Sobol, 17 Ware Dr., Norfolk, Mass. 02056

[21] Appl. No.: 612,944

[22] PCT Filed: Sep. 13, 1994

[86] PCT No.: PCT/US94/10269

§ 371 Date: Aug. 29, 1996

§ 102(e) Date: Aug. 29, 1996

[87] PCT Pub. No.: WO95/08221

PCT Pub. Date: Mar. 23, 1995

Related U.S. Application Data

[63] Continuation-in-part of Ser. No. 120,957, Sep. 13, 1993.

[51] Int. Cl.$^6$ ..................................................... H03M 1/66
[52] U.S. Cl. ........................... 341/144; 341/61; 341/123; 341/143; 364/724.1
[58] Field of Search ............................... 341/61, 77, 123, 341/143, 144; 364/724.1

[56] References Cited

U.S. PATENT DOCUMENTS

| | | | |
|---|---|---|---|
| 4,179,670 | 12/1979 | Kingsbury | 331/10 |
| 4,281,318 | 7/1981 | Candy et al. | 341/61 |
| 4,797,845 | 1/1989 | Stikvoort | 364/724.1 |
| 4,953,117 | 8/1990 | Lagadec | 364/724.1 |
| 4,954,824 | 9/1990 | Yamada et al. | 341/61 |

(List continued on next page.)

FOREIGN PATENT DOCUMENTS

| | | | |
|---|---|---|---|
| 0227172 | 7/1987 | European Pat. Off. | H03H 17/06 |
| 0 227 172 | 7/1987 | European Pat. Off. | H03H 17/06 |
| 0 512 619 | 11/1992 | European Pat. Off. | H03H 17/06 |
| 0227172 | 7/1997 | European Pat. Off. | |
| 94 08395 | 4/1994 | WIPO | H03H 17/06 |
| 95 08220 | 3/1995 | WIPO | H03H 17/06 |
| 95 08221 | 3/1995 | WIPO | H03H 17/06 |

OTHER PUBLICATIONS

International Search Report from International Application PCT/US94/10268, filed Sep. 13, 1994.

International Search Report from International Application PCT/US94/10269, filed Sep. 13, 1994.

International Search Report from International Application PCT/US95/03739, filed Mar. 23, 1995.

J. Janssen, et al. A New Principle/IC for Audio Sampling Rate Conversion, presented at the 96th Convention, Feb. 26, 1994–Mar. 1, 1994.

(List continued on next page.)

*Primary Examiner*—Howard L. Williams
*Attorney, Agent, or Firm*—Wolf, Greenfield & Sacks, P.C.

[57] ABSTRACT

A method and apparatus for digital to analog conversion using sigma-delta modulation of the temporal spacing between digital samples. The method and apparatus of the present invention provides for sigma-delta modulation of the time base such that errors produced by nonuniform sampling are frequency-shaped to a region (i.e., shifted to higher frequencies) where they can be removed by conventional filtering techniques In one embodiment, the digital data is interpolated by a fixed ratio and then decimated under control of a sigma-delta modulated frequency selection signal that represents, on average, the data rate of the incoming digital data stream. In another embodiment, the digital data is interpolated under control of a sigma-delta modulated frequency selection signal that represents, on average, the data rate of the incoming digital data stream and then decimated by a fixed ratio. The frequency signal selection number is modulated using an n-th order m-bit sigma-delta modulator. Data thus emerges from the interpolation/decimation process at the clock rate of the n-th order m-bit sigma-delta modulator. The method and apparatus converts the data rate of the incoming digital data stream to the data rate of the n-th order m-bit sigma-delta modulator.

22 Claims, 13 Drawing Sheets

U.S. PATENT DOCUMENTS

| | | | |
|---|---|---|---|
| 4,987,373 | 1/1991 | Soo | 328/155 |
| 4,990,911 | 2/1991 | Fujita et al. | 341/123 |
| 5,075,679 | 12/1991 | Gazsi | 341/143 |
| 5,111,417 | 5/1992 | Belloc et al. | 364/724.1 |
| 5,119,093 | 6/1992 | Vogt et al. | 341/123 |
| 5,121,065 | 6/1992 | Wagner | 324/607 |
| 5,157,395 | 10/1992 | Del Signore et al. | 341/143 |
| 5,204,827 | 4/1993 | Fujita et al. | 364/724.1 |
| 5,227,787 | 7/1993 | Kurashina | 341/61 |
| 5,313,205 | 5/1994 | Wilson | 341/144 |
| 5,353,026 | 10/1994 | Wilson | 341/143 |

OTHER PUBLICATIONS

Richard J. Higgins, Digital Signal Processing in VLSI, Prentice Hall, Englewood Cliffs, NJ 07632, 1990, pp. 29–31.

Douglas F. Elliott, et al, Fast Transforms, Algorithms, Analyses, Applications, 1982, Academic Press, p. 13.

Paul J. Hurst, et al. A Programmable Clock Generator Using Noise Shaping and Its Application in a Switched–Capacitor Filter, Solid State Circuits Research Laboratory, Dept. of Electrical and Computer Engineering, University of California, Davis (two pages), no date of reference available.

Electronique, No. 24, Jan. 1993, Paris, France, pp. 42–44, Trazeguet, H., "Les CAN Delta–Sigma Deviennent Programmables".

Patent Abstracts of Japan, vol. 003, No. 018 (E–091) Feb. 16, 1979 & JP–A–53147409 (Fujitsu Ltd.) Dec. 22, 1978.

IEEE Transactions On Instrumentation And Measurement, vol. 41, No. 6, 1 Dec. 1992, pp. 868–873, Park S. "Multistage Decimation Filter Design Technique For High–Resolution Sigma–Delta A/D Converters".

IEEE Transactions on Signal Processing, vol. 41, No. 1, 1 Jan. 1993, pp. 131–146, Sathe V. P. et al. "Effects Of Multirate Systems On the Statistical Properties Of Random Signals".

Patent Abstracts of Japan, 3:18 (E–091), Feb. 16, 1979 & JP–A–53147409, Fujitsu Ltd., Dec. 22, 1978.

Trézéguet, H., "Les CAN Delta–Sigma deviennent programmables", Electronique, Paris, France, 24(42–44) 1993.

DIGITAL TO ANALOG CONVERSION USING NONUNIFORM SAMPLE RATES

CROSS REFERENCE TO RELATED APPLICATIONS

This application is a continuation-in-part of application Ser. No. 08/120,957, filed Sep. 13, 1993, entitled DIGITAL TO ANALOG CONVERSION USING NONUNIFORM SAMPLE RATES by the same inventors, which is incorporated herein by reference.

BACKGROUND OF THE INVENTION

1. Field of the Invention

The present invention relates generally to the field of methods and circuits for digital to analog conversion. More particularly, the present invention relates to a method and circuit for digital to analog signal conversion using sigma-delta modulation of the temporal spacing between digital samples.

2. Discussion of the Related Art

Digital to Analog Converter (DAC) circuits and methods for digital to analog conversion are well-known in the art. Conventional DACs receive a binary level single or multi-bit digital signal on an input terminal(s) and, as a function of a reference voltage, convert the digital signal into a corresponding analog signal.

One type of DAC that has recently become popular is the so-called sigma-delta DAC. There are many references describing sigma-delta systems. One example is entitled *Mixed-Signal Design Seminar* published by Analog Devices, Inc., 1991, which is incorporated herein by reference.

As shown in FIG. 1, a conventional sigma-delta digital to analog converter includes an interpolation filter 1 that increases the sample rate (i.e. data rate or sampling frequency) of a digital input signal by some predetermined oversampling ratio to a higher sampling rate and rejects any signal images that occur at approximately the Nyquist rate of the input signal. The higher rate digital signal is then transmitted to a sigma-delta modulator 2 that noise shapes the digital data stream and reduces the sample width to one bit. In digital to analog converters, the sigma-delta modulator is typically all digital. The sigma-delta modulator effectively low pass filters the signal of interest and high pass filters the quantization noise on the signal. The output of the sigma-delta modulator is typically a high frequency one-bit data stream. The one-bit DAC 3 receives the modulator output and provides a corresponding analog signal that is either plus or minus full scale. The output of the one-bit DAC is transmitted to an analog smoothing filter 4 that averages the output of the one-bit DAC and removes the shaped quantization noise that resides in the upper frequency area.

One of the limitations of conventional DACs including the sigma-delta DAC illustrated in FIG. 1 is that they only determine the magnitude of the input signal at equally spaced temporal intervals. This is known as uniform sampling. Additionally, in conventional DACs, the sample rate, that is, the data rate of the incoming digital data stream cannot be independent of the master clock that is used to clock the DAC. The incoming digital data rate must be some integer division of the master clock on the DAC chip. This means that if the DAC were to receive digital data at two different data rates, that are not necessarily divisible into the master clock (or more generally, digital data at a rate that is not integrally divisible into the master clock), there must be two different frequency master clocks available for clocking the DAC (or more generally, there must be a master clock that has an integer relationship with the data rate of the incoming digital data available to clock the DAC).

Another problem with conventional DACs is that they typically are not designed to be clocked by an externally supplied clock signal. The components of the DAC are typically optimized to operate at the clock frequency determined by the master clock on the DAC chip. This leads to the additional limitation that some DACs cannot lock to and operate at some externally supplied clock signal. Therefore, if there are any changes in the digital data rate, since the incoming digital data stream and the master clock for the DAC are not necessarily related to each other, and changes in the relative frequencies of the data rate and the master clock can disrupt the entire digital to analog conversion process.

Therefore, an object of the present invention is to provide a method and apparatus for performing digital to analog conversion using nonuniform sampling (i.e., variable temporal spacing of the sampling points).

Another object of the present invention is to provide a method and apparatus for performing digital to analog conversion that can lock to an externally supplied clock signal and can provide a sampling rate that is independent of the DAC master clock.

SUMMARY OF THE INVENTION

The present invention overcomes the limitations of the prior art by providing a method and apparatus for digital to analog conversion using nonuniform sampling. The apparatus includes an interpolator or other comparable circuitry such as a sample and hold circuit for receiving digital signals at a first data rate and for supplying the digital signals at an increased data rate and a decimator, coupled to the interpolator, for decimating the digital signals at the increased data rate to provide digital signals at a second data rate. In one embodiment, a sigma-delta modulator is coupled to and controls the decimator and provides a sigma-delta modulated output signal representative of the first data rate and controls the decimator to provide the digital signals at the second rate. This embodiment of the invention interpolates digital data by a fixed ratio and then decimates the interpolated digital data by a variable ratio depending on the second data rate desired. In another embodiment, a sigma-delta modulator is coupled to and controls the interpolator and provides a sigma-delta modulated output signal representative of the first data rate and controls the interpolator to provide a digital data stream at the increased data rate so that, upon decimation by the decimator, the digital signals are at the second rate. This embodiment of the invention interpolates the digital data by a variable ratio depending on the second data rate desired and then decimates the interpolated data by a fixed ratio. A digital to analog converter is coupled to and receives the digital signals at the second data rate from the decimator and converts the digital signals at the second data rate to analog signals.

In another embodiment of the invention, a phase locked loop (PLL) which may be a digital or analog PLL is provided for receiving a signal representative of the first data rate, locking to the signal, and providing a control signal to the sigma-delta modulator that controls the sigma-delta modulator to provide the sigma-delta modulated output signal. The sigma-delta modulator forms part of the digitally controlled oscillator in the PLL. The phase locked loop allows the circuit to lock to and track any externally-supplied clock signal.

Broadly stated, the method of the present invention includes sigma-delta modulation of the time base such that errors produced by nonuniform sampling are frequency-shaped to a region (i.e., shifted to higher frequencies) where they can be removed by conventional filtering techniques. That is, the method of the present invention provides a temporally noise-shaped digital signal.

In one embodiment of the invention, the method is to perform a fixed interpolation (or other method of increasing the data rate of the digital signal) and filtering to remove images followed by variable decimation with the decimation controlled by a sigma-delta modulator that is fed a frequency selection signal representing the sampling frequency of the input data stream. Fixed interpolation means that the interpolation ratio is the same regardless of the sample rate. Variable decimation means that the decimation ratio is varied as a function of the desired output sample rate. A digital data stream at a data rate within some predetermined limits is interpolated to a higher data rate. This higher data rate digital data stream is then decimated using a control signal that is a sigma-delta modulated signal that represents the data rate of the incoming digital data stream. The frequency selection signal is modulated using an n-th order m-bit sigma-delta modulator. This control signal (the sigma-delta modulated frequency selection number output by the sigma-delta modulator) represents, on average, the data rate of the incoming digital data stream. Data thus emerges from the interpolation/decimation process at the clock rate of the n-th order m-bit sigma-delta modulator.

In another embodiment of the invention, the method is to perform a variable interpolation (or other method to increase the sample rate of the digital data stream) and filtering to remove images followed by a fixed decimation with the interpolation controlled by a sigma-delta modulator that is fed a frequency selection number representing the sampling frequency of the input data stream. Variable interpolation means that the interpolation ratio is varied as a function of the desired output sample rate. Fixed decimation means that the decimation ratio is the same regardless of the sample rate. A digital data stream at a data rate within some predetermined limits is interpolated to a higher data rate using a control signal that is a sigma-delta modulated signal that represents the data rate of the incoming digital data stream. The frequency selection signal is modulated using an n-th order m-bit sigma-delta modulator. This control signal (the sigma-delta modulated frequency selection number output by the sigma-delta modulator) represents, on average, the data rate of the incoming digital data stream. The control signal controls the interpolator to increase the data rate such that, upon fixed decimation, data emerges from the interpolation/decimation process at the clock rate of the n-th order m-bit sigma-delta modulator.

The methods of the invention thus convert the data rate of the incoming digital data stream to the data rate of the n-th order m-bit sigma-delta modulator.

The features and advantages of the present invention will be more readily understood and apparent from the following detailed description of the invention, which should be read in conjunction with the accompanying drawings, and from the claims which are appended at the end of the detailed description.

BRIEF DESCRIPTION OF THE DRAWINGS

In the drawings, which are incorporated herein by reference and in which like elements have been given like reference characters.

DETAILED DESCRIPTION

For purposes of illustration only, and not to limit generality, the present invention will now be explained with reference to specific data rates, interpolation (or more generally sample rate increase) ratios, decimation ratios, and clock frequencies of operation. One skilled in the art will recognize that the present invention is not limited to the specific embodiment disclosed, and can be more generally applied to other circuits and methods having different operating parameters than those illustrated.

Figure 2:
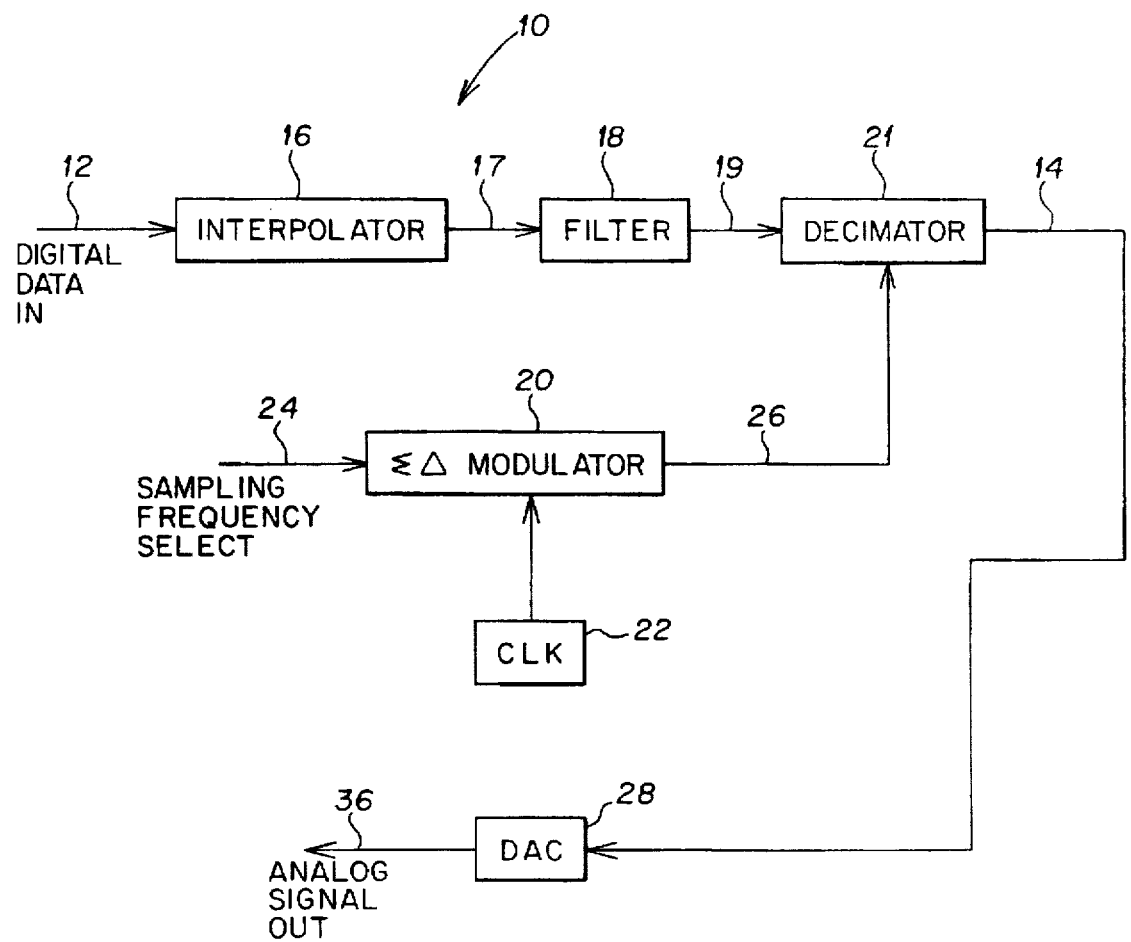
FIG. 2 is a block diagram of a general DAC circuit incorporating a first embodiment of the invention.

FIG. 2 is a block diagram broadly illustrating a first embodiment of the invention. The overall purpose of circuit 10 is to receive a digital data stream on line 12 at any data rate within a predetermined working range of the system, increase the sampling rate of the data stream and then decimate this higher rate data stream so that the data stream presented on line 14 is at a fixed, predetermined data rate. The first embodiment uses fixed interpolation followed by variable decimation. In other words, circuit 10 receives digital data at any data rate within the predetermined working range of the system, and converts this data to a digital data stream at another data rate. The other data rate may or may not be the same as the data rate of the input data stream and may be a fixed or a variable rate. The digital data stream on line 12 may be of any width.

In the circuit illustrated in FIG. 2, an interpolator 16 receives the digital data stream on line 12 at any data rate within the predetermined working range. Interpolator 16 increases the sample rate of the digital data stream (that is, converts the digital data stream into a higher sample rate digital data stream) on line 12 by, for example, inserting zeros between data samples, in a manner well-known to those skilled in the art. One skilled in the art will appreciate that other techniques may be used for increasing the sample rate of the data stream on line 12, such as sample and hold techniques. A higher sample rate digital data stream 17 is then sent to a digital filter 18 which removes any images of the original digital signal as a result of the interpolation process. The filtered digital data stream on line 19 is then sent to a decimation block 21 that decimates digital data stream on line 19 under control of the sigma-delta modulator 20. Although filter 18 and decimation block 21 have been illustrated as separate circuit elements for illustrative purposes, one skilled in the art will appreciate that these functions may be performed by a single computational element, such as an FIR or IIR filter in a well-known manner.

The sigma-delta modulator 20 produces digital data at the frequency of clock 22, the data controlling the decimation of decimation block 21. As will be explained in more detail hereinafter, the sigma-delta modulator 20 sigma-delta modulates a signal 24 representative of the data rate of the digital data stream on line 12. An example will serve to illustrate this function. Assume that the data rate of the data stream on line 12 is 48 kHz. Interpolator 16 increases this data rate to 18.432 mHz by interpolating the data by a factor of 384. Assume the frequency of clock 22 is 3.072 mHz. Since the data rate of data stream 12 is 48 kHz, signal 24 is therefore a multi-bit digital number representative of a sampling rate of 48 kHz where the number of bits in the digital number control the precision with which the data rate of digital data stream on line 12 can be specified. This digital number is sigma-delta modulated by the sigma-delta modulator 20 and used To control decimation block 21 to produce one output signal for every six samples in digital data stream 19. The 18.432 mHz data is then effectively decimated by a factor of six and the digital data stream on line 14 is therefore at, on average, a 3.072 mHz data rate.

Sigma-delta modulator 20 is preferably an n-th order m-bit sigma-delta modulator. The higher the order of the sigma-delta modulator, the better the noise shaped characteristics of the output signal on line 26. The output signal on line 26 of sigma-delta modulator 20 is chosen to be m-bits (where $m \geq 1$ and is more than one bit in a preferred embodiment) because, as the number of bits is increased, the clock rate necessary to operate sigma-delta modulator 20 can be reduced. However, it is to be appreciated that the invention is not so limited. Sigma-delta modulator 20 could also be a one bit modulator if the clock frequency used to run the modulator is appropriately increased.

A key feature of the present invention is that the temporal spacing of the sampling points is controlled by the n-th order m-bit sigma-delta modulator such that any errors (i.e., noise on the sampling points) produced by this nonuniform sampling are shaped in the frequency domain. That is, the digital signal produced by the interpolation/decimation process of the present invention is temporally noise-shaped. As is well-known in the field of sigma-delta systems, this error produced by noise resulting from the nonuniform sampling can be removed by conventional digital filtering techniques.

Several other advantages are also obtained. By appropriate choice of the rate at which the sigma-delta spaced sampling points are generated and the number of bits used in controlling the spacing of these sampling points, the signal to noise ratio of the digital data stream on line 14 can be controlled. Further degrees of freedom are available by varying the order of the sigma-delta modulator used to control the sampling points. In another aspect of the invention, the degree of filtering used on the digital data stream on line 17 can also be varied to vary the signal to noise ratio as well.

As shown in FIG. 2, the output data stream on line 14 is fed into a DAC 28 which may be any well-known type of digital to analog converter.

Figure 1:
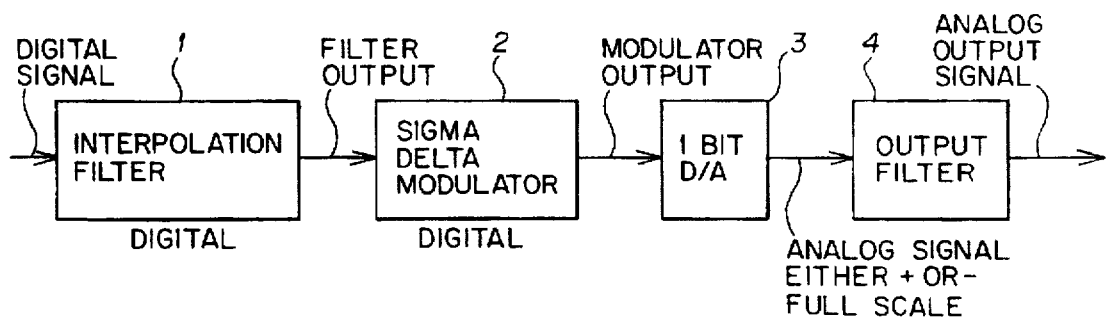
FIG. 1 is a block diagram of a conventional sigma-delta digital to analog converter (DAC)
Figure 3:
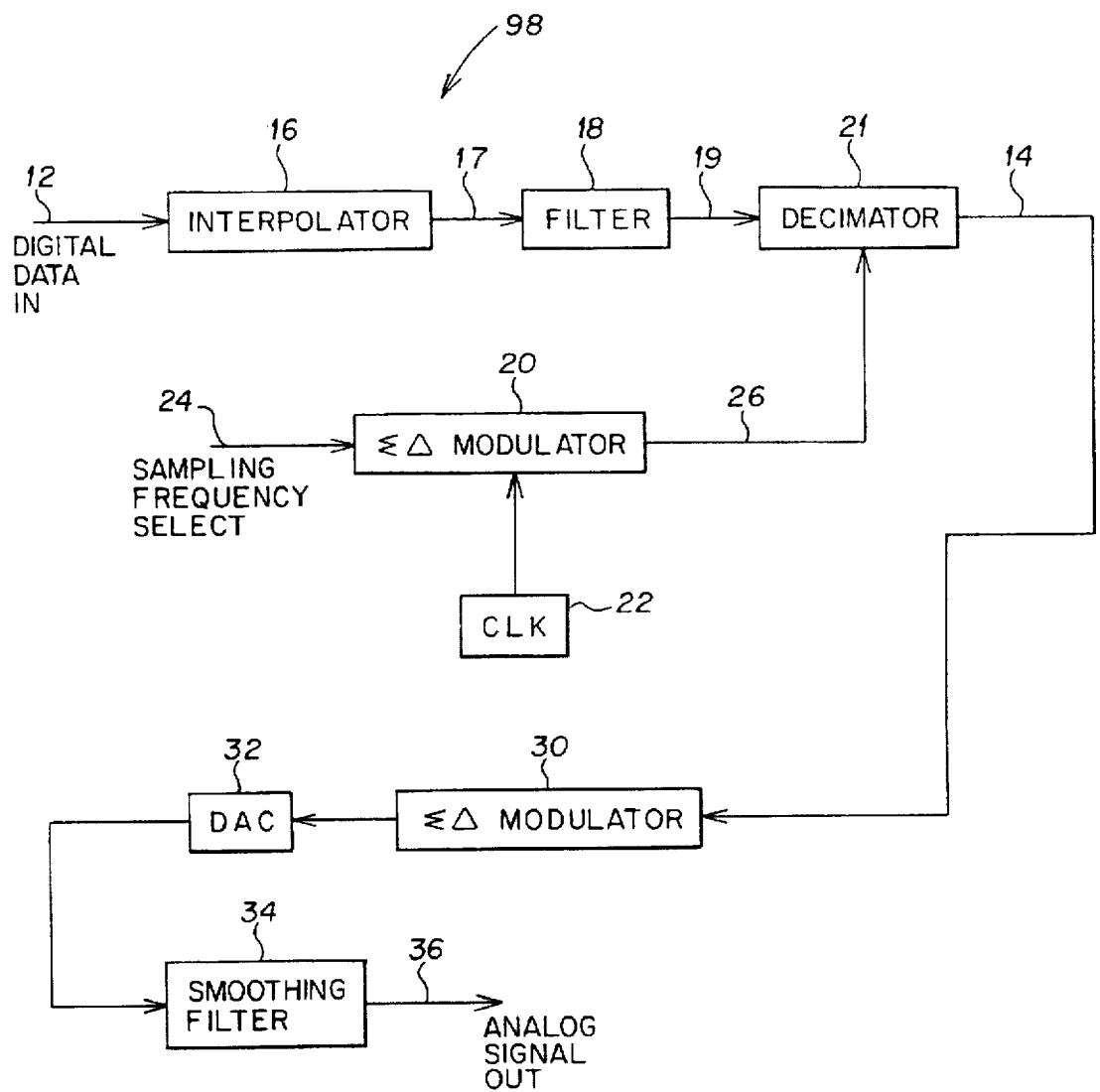
FIG. 3 is a block diagram of a sigma-delta DAC circuit incorporating the first embodiment of the invention.

FIG. 3 illustrates a sigma-delta DAC using the present invention. In FIG. 3, the digital data stream on line 14 is fed into a sigma-delta modulator 30, digital to analog converter 32, and an analog smoothing filter 34 to produce an analog output signal on line 36. Sigma-delta modulator 30, digital to analog converter 32, and analog smoothing filter 34 are similar to those illustrated in FIG. 1 and are well-known to those skilled in the art and therefore will not be discussed in further detail herein.

Figure 4:
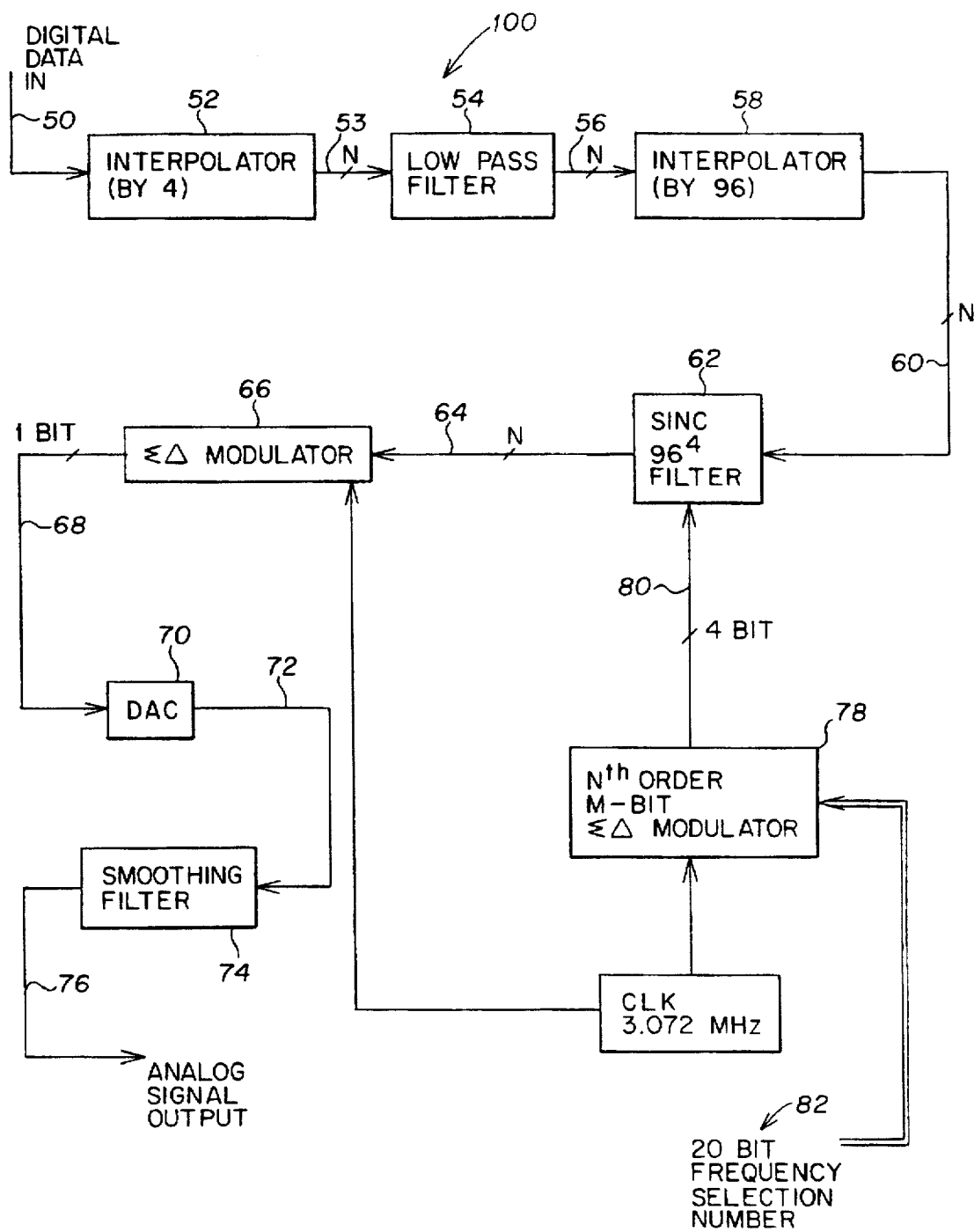
FIG. 4 is a more detailed block diagram of the circuit of FIG. 3.

FIG. 4 illustrates a more detailed embodiment of the DAC of FIG. 3. In the embodiment 100 of FIG. 4, an n-bit wide digital data stream on line 50 which may be, for example, in the range of 4 kHz to 48 kHz is received by interpolator 52. Interpolator 52 increases the sample rate of digital data stream on line 50 by a factor of four using, for example, a zero fill technique that inserts zeros between the digital samples. The higher sample rate signal output by interpolator 52 (now in the range of 16 kHz to 192 kHz) is then fed into a digital low pass filter 54 which may be, for example, a finite impulse response type filter. Low pass filter 54 filters out of band images of digital signal 50 out of the digital data stream on line 53. The filtered digital data stream on line 56 from low pass filter 54 is then fed into interpolator 58 that increases the sample rate of the digital data stream on line 56 by a factor of ninety-six. Inserting ninety-five zeros into the digital data stream on line 56 will reduce the gain of the original signals because of the dilution of the signal by the inserted zeros. However, as is well-known, the parameters of filter 62 can be adjusted to compensate for this loss of gain. The higher sample rate digital data signal on line 60 (now in the range of 1.536 mHz to 18.432 mHz) provided by interpolator 58 is fed into digital filter 62.

As stated previously, other techniques, such as sample and hold techniques, may be used to increase the sample rate in place of interpolators 52, 58. The use of a sample and hold technique is advantageous because it automatically compensates for the energy lost in creating the images of the original signal due to the interpolation process.

In one embodiment, digital filter 62 is a sinc $96^4$-type filter that is designed to have zeros at the image frequencies of the digital data stream on line 60. Filter 62 could, however, be any type of IIR or FIR filter. In the preferred embodiment illustrated in FIG. 4, digital filter 62 provides both a low pass filtering function and a decimation function. One skilled in the art will appreciate that these two functions could be separated in the manner illustrated in FIGS. 2 and 3. As will be explained in greater detail hereinafter, filter 62 outputs a digital data stream on line 64 at 3.072 mHz. The digital data stream on line 64 is input to a sigma-delta modulator 66 that is clocked at 3.072 mHz. Sigma-delta modulator 66 could also be an n-th order m-bit modulator similar to sigma-delta modulator 78. Sigma-delta modulator 66 outputs a single-bit data stream on line 68 that is fed into digital to analog converter 70. The analog signal on line 72 output by digital to analog converter 70 is fed through smoothing filter 74 to produce a final analog output signal on line 76.

It is to be noted that the digital data streams on lines 53, 56, 60, and 64 are indicated as being n-bits wide in FIG. 4. N may be any number of bits and is typically chosen to be the widest bit stream commensurate with the signal-to-noise ratio requirements of the particular application. Furthermore, the digital data streams may be different widths on each of the lines.

The n-th order m-bit sigma-delta modulator 78 provides a four-bit number on line 80 that controls filter 62 to produce the output data stream on line 64. Sigma-delta modulator 78 is, in one embodiment, a fourth order four-bit modulator. Sigma-delta modulator 78 is also clocked using a 3.072 mHz clock.

In one embodiment, a twenty-bit frequency selection number 82 is input into sigma-delta modulator 78. Frequency selection number 82 ranges from $-2^{19}$ to $+2^{19}$. This twenty-bit number controls the precision with which the four-bit number output by sigma-delta modulator 78 represents the sampling rate of the input digital data stream on line 50. Sigma-delta modulator 78 modulates the twenty-bit number to produce sigma-delta modulated four-bit codes that control filter 62. The first bit of the code is a sign bit. The remaining three bits produce codes that direct the filter 62 to calculate and produce an output every P samples of data stream on line 60, effectively sample rate converting the data stream.

Table 1 illustrates the relationship among the four-bit codes that are produced by sigma-delta modulator 78, the intervals at which filter 62 produces an output, and the sampling frequency that the four-bit code corresponds to when modulator 78 is clocked using a 3.072 mHz clock. Some examples will illustrate the operation of the system.

TABLE 1

| 4 BIT CODE | PRODUCE AN OUTPUT EVERY P SAMPLES ALLOW P CLOCKS TO PASS THROUGH | CORRESPONDING TO SAMPLING FREQUENCY OF (kHz) |
| --- | --- | --- |
| +4 | 8 | 64 |
| +3 | 7 | 56 |
| +2 | 6 | 48 |
| +1 | 5 | 40 |
| 0 | 4 | 32 |
| −1 | 3 | 24 |
| −2 | 2 | 16 |
| −3 | 1 | 8 |
| −4 | 0 | DC |

Assume, for purposes of illustration, that the digital data stream on line 50 has a data rate of 48 kHz. Interpolator 52 increases this data rate to 192 kHz. Interpolator 58 increases the 192 kHz sampling rate to 18.432 mHz. To produce the digital data stream on line 64 at 3.072 mHz at the output of filter 62, the digital data stream on line 60 at 18.432 mHz must be decimated by a factor of six. Therefore, twenty-bit frequency selection number 82 is selected such that upon sigma-delta modulation by the fourth order four-bit sigma-delta modulator 78, the four bit codes generated will be, on average, a +2 code although other four bit codes will be produced but with a lower frequency of occurrence.

A key point to remember is that the +2 code is the resulting average of all the codes produced by sigma-delta modulator 78 upon sigma-delta modulation of twenty-bit frequency selection number 82. A +2 code is not produced every time sigma-delta modulator 78 is clocked even though the input and output sample rate are related to each other by an integer multiple. Even if the sample rates were related to each other by an integer multiple, any errors, no matter how small, that result in a temporal displacement between the sample points in the input digital data stream on line 50 and the sample points in the rate-converted digital data stream on line 64 would increase the signal to noise ratio to a point where the digital to analog conversion process would not be acceptable. In the present invention, the time base (i.e., the temporal spacing between samples) is sigma-delta modulated so that the errors due to temporal displacement between the input and rate-converted digital data stream that cause noise are pushed into a higher frequency range. This noise is then removed by conventional filtering techniques such as in analog smoothing filter 34.

As shown in Table 1, the +2 (on average) code directs filter 62 to produce an output every six data samples of digital data stream on line 60. This results in the output data stream on line 64 having a data rate (i.e., a sample rate or sampling frequency) of 3.072 mHz on average.

In another example, assume that the digital data stream on line 50 has a data rate (i.e., a sample rate or sampling frequency) of 4 kHz. Interpolator 52 increases this data rate to 16 kHz. Interpolator 58 increases the 16 kHz data rate to 1.536 mHz. In order that the digital data stream on line 64 have a data rate of 3.072 mHz, the digital data stream on line 60 at 1.536 mHz must be effectively interpolated by a factor of 2. Therefore twenty-bit frequency selection number 82 is chosen such that sigma-delta modulator 78 produces, on average, an equal number of −3 and −4 codes although other four bit codes will be produced, but with a lower frequency of occurrence. That is, occasionally, −2, −1, and even less frequently, +1, +2 codes will be produced. As shown in Table 1, the −3 code directs sinc filter 62 to produce an output for each input sample corresponding to a sampling frequency of 8 KHz for the clock frequencies and interpolation ratios illustrated.

The −4 code is used to control filter 62 so that it does not produce a new output but rather repeats the previous output. That is, the filter 62 is directed to produce an output, but since a new data point has not been received and the previous data point is still at the filter input, the filter 62 repeats the calculation and produces the same output again.

At the illustrated interpolation ratios and clock frequencies, the −3 code represents a sampling frequency of 8 kHz and the −4 code represents a sampling frequency of DC (i.e., no signal). Therefore, on an average of many samples, the −3 and −4 four-bit codes produce a sampling frequency of 4 kHz To provide a digital data stream on line 64 at 3.072 mHz.

One skilled in the art will appreciate that any sampling frequencies within the 0 to 64 kHz range may be produced by varying the ratio of four-bit codes produced by sigma-delta modulator 78. For example, to obtain a sampling frequency between 56 kHz and 64 kHz, the appropriate ratio of +3 and +4 codes would be output by sigma-delta modulator 78 as a function of twenty-bit number 82. One skilled in the art will also appreciate that any sample rate within the working range of the system can be produced through the appropriate combination of four-bit codes.

Although a four-bit sigma-delta modulator has been illustrated, the invention is not so limited. For example, a sigma-delta modulator that outputs fewer bits can be used if the modulator is clocked at a faster rate. In the same manner, a sigma-delta modulator that outputs a larger number of bits can be used and the modulator can then be clocked at a lower rate. One skilled in the art will appreciate the number of bits used and the clock rate used are a function of the desired noise shaping and signal to noise ratio, and may be traded-off depending upon the requirements of a particular application.

One skilled in the art will appreciate that, in the circuit of FIG. 4, both the magnitude and the temporal spacing of the digital samples is sigma-delta encoded by sigma-delta modulator 66 and sigma-delta modulator 78, respectively.

One of the advantages of sigma-delta modulation of the time base is that the jitter or time variation produced on the sampling time (or sampling interval) due to the fact that digital filter 62 or decimator 21 (under control of sigma-delta modulator 20 or 78) respectively produces output samples at time intervals that may not correspond exactly to the specified sampling frequency (3.072 mHz) is varied by the sigma-delta modulator so that any errors that result from the noise or jitter around the sampling point has a sigma-delta characteristic that can be removed by conventional filtering techniques, as for example, by analog smoothing filter 74.

Figure 5:
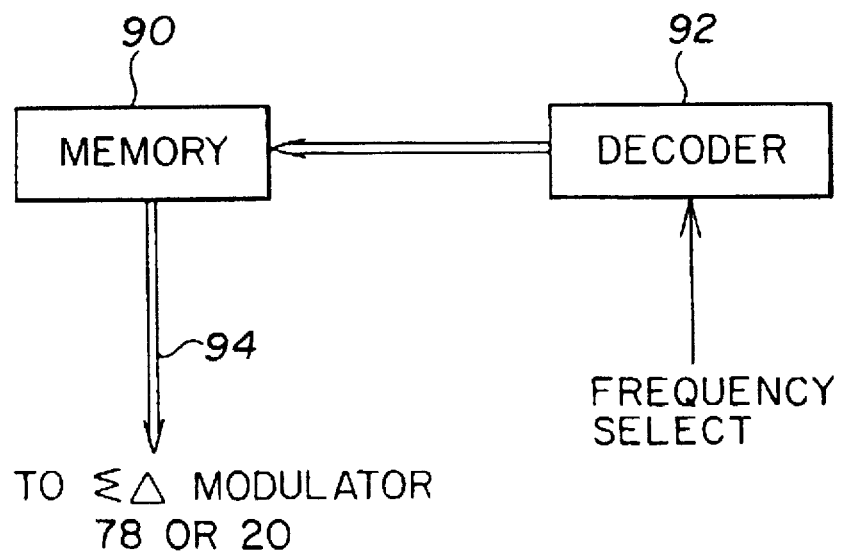
FIG. 5 is a block diagram of a circuit for supplying previously stored frequency numbers to the n-th order m-bit sigma-delta modulator of FIGS. 2–4, 8–10, and 12.

FIG. 5 is a block diagram of an alternative system for determining frequency selection number 82. In FIG. 5, a memory 90 (which may be RAM or ROM, for example) is used to store a look up table containing twenty-bit numbers and the sampling frequency to which they correspond. In response to a frequency select signal from a user or an external source, decoder 92 selects the twenty-bit number from memory 90 most closely corresponding to the desired sampling frequency specified by the frequency select signal. The twenty-bit number is then output on bus 94 to sigma-delta modulator 78.

Figure 6:
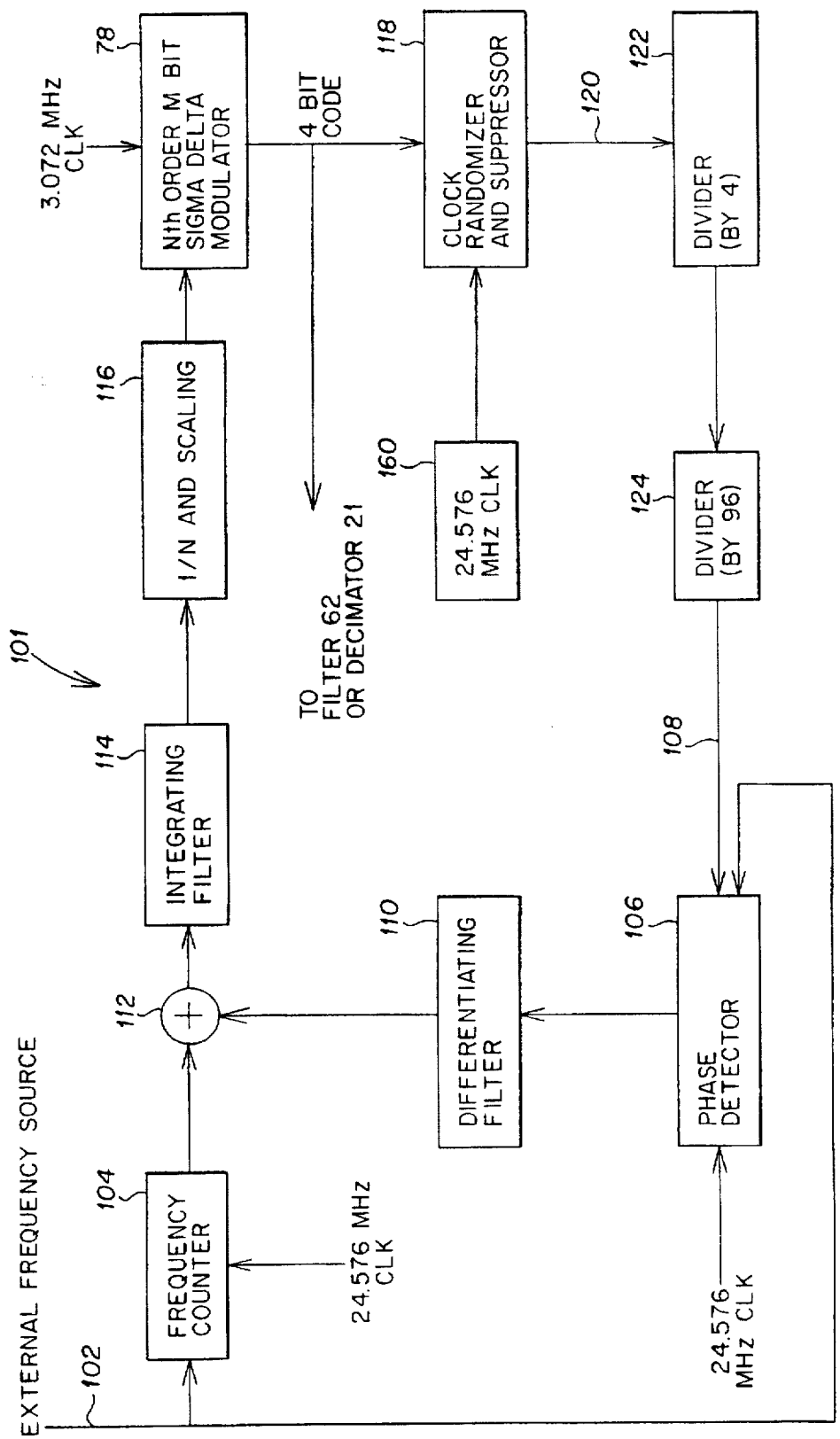
FIG. 6 is a block diagram of a locking circuit that may be used in conjunction with the circuits of FIGS. 2–4, 8–10, and 12 to lock the DAC to an externally supplied clock signal.

FIG. 6 illustrates another embodiment of the invention in which a digital phase locked loop 101 incorporating sigma-delta modulator 20 or 78 is added to the circuit of FIGS. 2–4 to allow the digital to analog converter to operate at and lock to an external clock signal such as an off-chip clock signal. In circuit 101, an external clock source on line 102 is applied to a frequency counter 104 that produces a signal representative of the period of the external frequency source on line 102. In addition, the external clock on line 102 is applied to a phase detector 106 that produces a signal proportional to the phase difference between the external clock on line 102 and a signal on line 108 to be described in more detail hereinafter. The output of the phase detector 106 is filtered by differentiating filter 110 and summed in summer 112 with the signal representative of the period of the external clock source on line 102 from the frequency counter 104. The output of summer 112 is fed into an integrating filter 114 that functions as a low-pass filter. The output of integrating filter 114 is then sent to a circuit 116 what converts the period to a frequency by performing a 1/period function and providing any application dependent scaling of the frequency signal. The signal from circuit 116 is then sent to sigma-delta modulator 78. The four-bit code from sigma-delta modulator 78 is used to control sinc filter 62 in the same manner as described in connection with the embodiment of FIG. 4 or decimate block 21 in the same manner as described in connection with the embodiment of FIGS. 2 and 3, respectively.

The four-bit code is also fed into a clock generation circuit 118 that effectively produces an output clock at 384 times greater than the signal on line 102. Circuit 118 performs this function by suppressing a certain number of 24.576 mHz clock cycles in response to the four-bit code from sigma-delta modulator 78. The following examples will serve to illustrate. Assume sigma-delta modulator 78 is clocked by a 3.073 mHz clock. For every 3.072 mHz clock, there are eight 24.576 mHz clocks applied to circuit 118. In accordance with Table 1, circuit 118 suppresses a number of 24.576 mHz clocks as a function of the four bit code output by sigma-delta modulator 78. For example, if the external frequency source on line 102 is 48 kHz, then sigma-delta modulator 78 outputs, on average, a +2 code. The +2 code directs circuit 118 to allow six out of every eight 24.576 mHz clocks to pass through. Stated another way, circuit 118 suppresses two out of every eight 24.576 mHz clocks in response to a +2 code.

If the external clock frequency source is 4 kHz, then sigma-delta modulator 78 outputs, on average, an equal number of −3 and −4 codes. The −3 code directs circuit 118 to allow one out of every eight 24.576 mHz clocks to pass through (i.e., circuit 118 suppresses seven out of every eight 24.576 mHz clocks in response to a −3 code). The −4 code directs circuit 118 to allow no 24.576 mHz clocks to pass through (i.e., circuit 118 suppresses eight out of every eight 24.576 mHz clocks in response to a −4 code). On average, therefore, one out of every sixteen 24.576 mHz clocks will pass through suppressor circuit 118 in response to an average of −3 and −4 codes.

If, however, the same clocks are suppressed for each four-bit code from sigma-delta modulator 78, then unwanted tones may appear in the output data stream on line 120. Therefore, circuit 118 also performs the additional function of randomly suppressing clock cycles in order to prevent unwanted tones in the output data stream on line 120. Randomizing ensures that pulses in each of the eight positions (recall that there are eight 24.576 mHz clock pulses for each 3.072 mHz clock pulse controlling sigma-delta modulator 78) are suppressed equally, on average. This may be accomplished by providing a latch for each bit position that is set whenever the pulse in that position is suppressed. Pulses in that position are not suppressed again until all latches corresponding to all the positions have been set, at which time the latches are cleared and the sequence of suppression is repeated. This reduces tones that result from the clock pulse suppressor. Clock suppressor circuits are well-known in the art. One example of such a circuit may be found in *Phase Locked Loops, Theory, Design, and Applications* by Dr. Roland E. Best, published by McGraw-Hill Book Company, ©1984. Clock randomizer/suppressor circuit 118 outputs a clock signal on line 120 that is sent through divider 122 having a divider ratio of 96 and a divider 124 having a divider ratio of 4 that reduce the suppressed and randomized 24.576 mHz clock output by clock randomizer circuit 118 to the frequency of the external clock on line 102. Circuits 122 and 124 may be counters.

For the examples just discussed above, if the external clock on line 102 is 48 kHz, then the signal on line 120 is approximately 18.432 mHz. When decimated by ninety-six and then four, the signal on line 108 is 48 kHz. If the external clock on line 102 is 4 kHz, then the signal on line 120 is approximately 1.536 mHz. When decimated by ninety-six and then four, the signal on line 108 is 4 kHz.

Circuit 116, sigma-delta modulator 78 and clock randomizer/suppressor circuit 118 together form a digitally-controlled oscillator.

This particular embodiment of the present invention thus allows a DAC to accept digital data at any data rate within the working range of the system, and lock to an externally supplied clock source to allow operation of the DAC at a clock frequency that is not necessarily the same as or even an integer or rational relationship with the master clock controlling the DAC.

The embodiment of the invention illustrated in FIGS. 2–5 may be characterized as using fixed interpolation followed by variable decimation. That is, the digital data stream on line 12 or 50 is interpolated by a fixed ratio to increase the sample rate. This higher sample rate digital signal is then variably decimated under control of sigma-delta modulator 20 to provide the digital data stream on line 14 at another sample rate.

Figure 7:
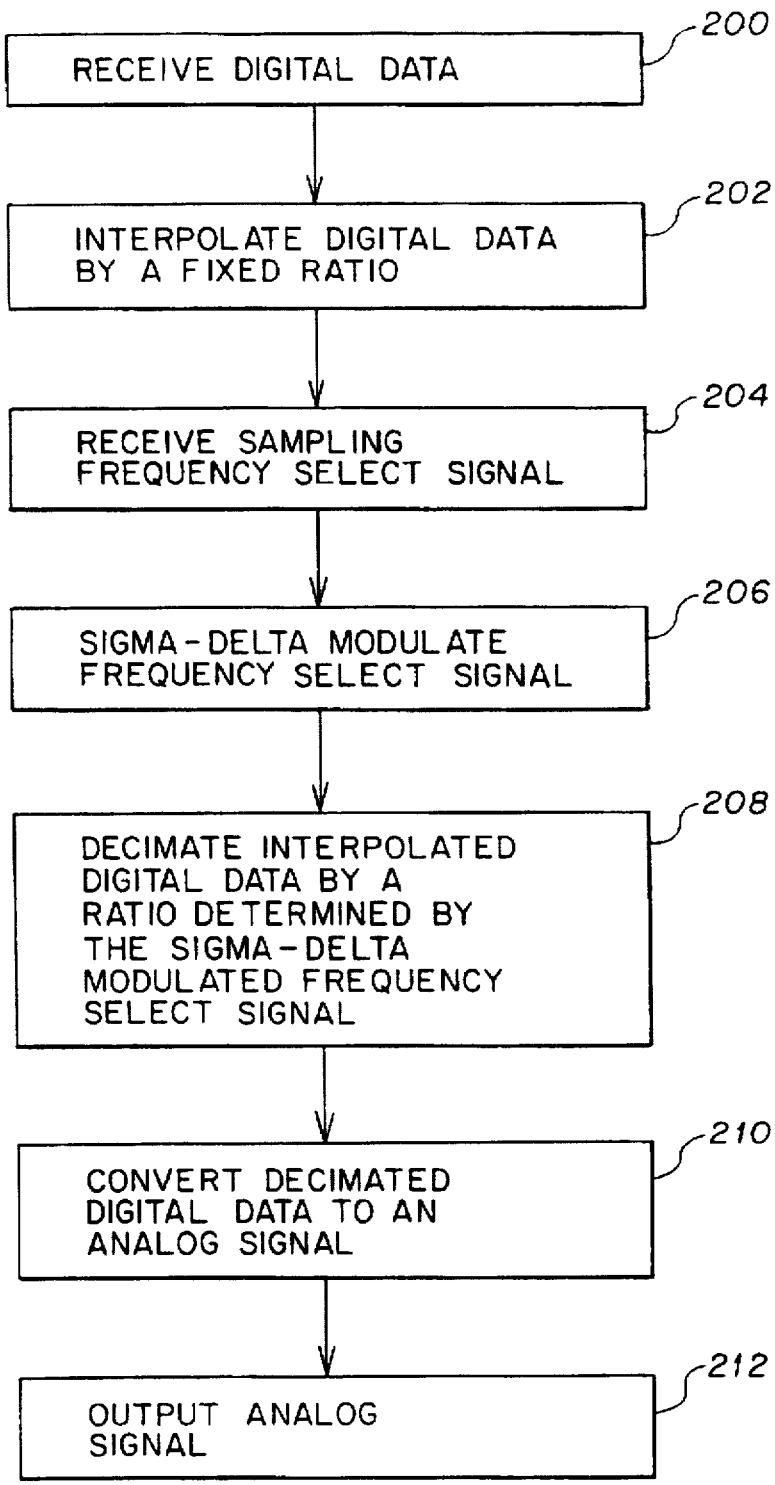
FIG. 7 is a flow chart illustrating the steps of the method of the invention using fixed interpolation followed by variable decimation.

FIG. 7 is a flow chart illustrating a first embodiment of the method of the present invention. FIG. 7 illustrates the method of fixed interpolation followed by variable decimation.

In FIG. 7, the method begins in step 200 in which the input digital data is received. From step 200, the method proceeds to step 202 in which the input digital data is interpolated by a fixed ratio to increase the sample rate of the digital data. From step 202, the method proceeds to step 204 in which a sampling frequency select signal representative of the sample rate of the digital data received in step 200 is received. From step 204, the method proceeds to step 206 in which the sampling frequency select signal is sigma-delta modulated. From step 206, the method proceeds to step 208 in which the interpolated digital data is decimated under control of the sigma-delta modulated frequency select signal by a ratio determined by the sigma-delta modulated frequency select signal. From step 208, the method proceeds to step 210 in which the decimated digital data is converted to an analog signal. From step 210, the method proceeds to step 212 in which the analog signal is output.

Another important advantage of the present invention arises because the output of sinc filter 62, regardless of the digital data rate of digital data stream on line 50, is always at a predetermined frequency (3.072 mHz in the illustrated embodiment). Additionally, because the output date rate is constant, in all embodiments, the outputs of several DAC channels that are receiving digital data at different data rates, can be added together by combining digital data streams on lines 64 from each DAC channel. The present invention thus provides an advantageous method and apparatus for mixing or combining digital signals (especially digital signals having differing data rates) together.

Figure 8:
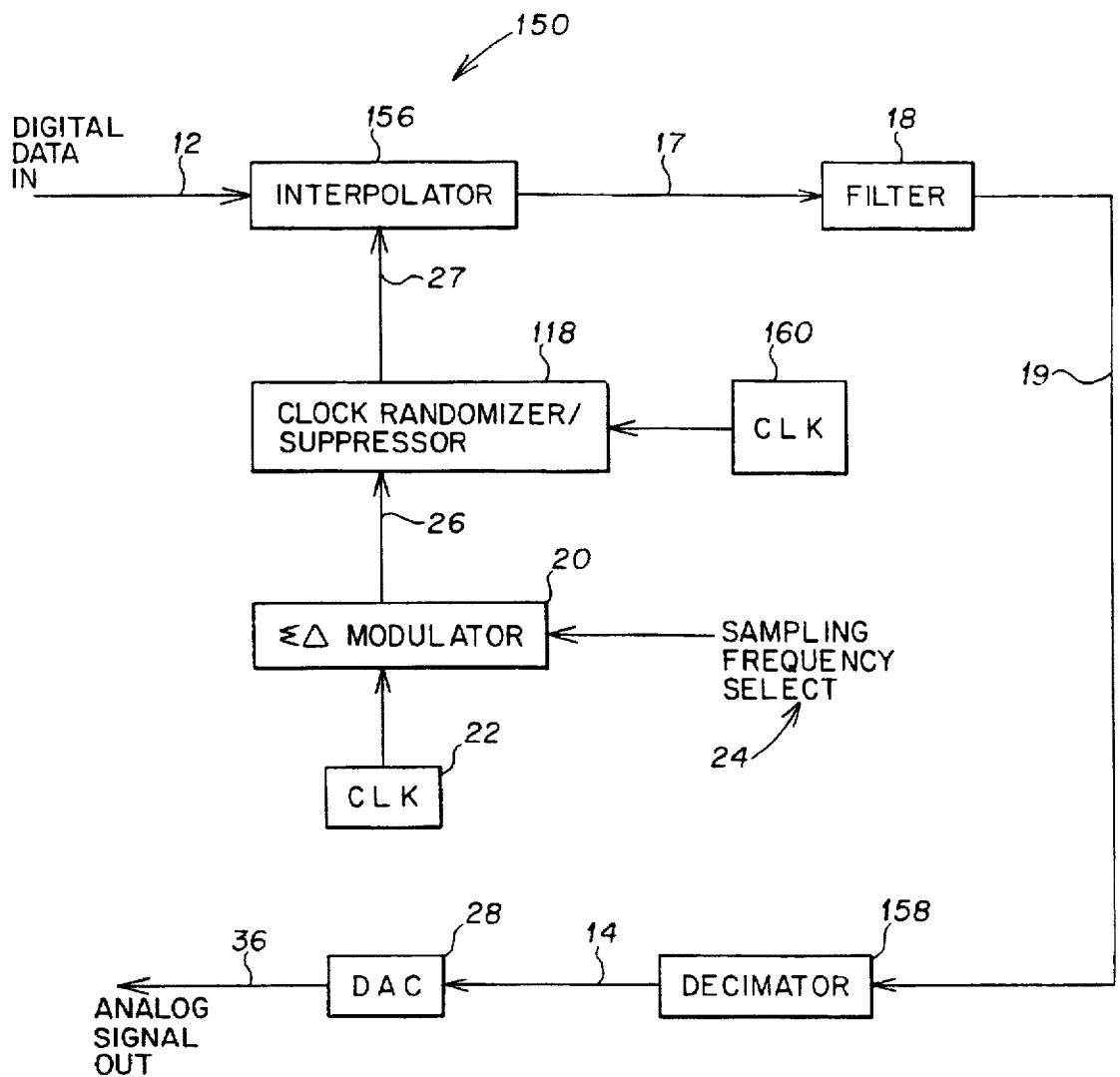
FIG. 8 is a block diagram of a general DAC circuit incorporating a second embodiment of the invention.

FIG. 8 is a block diagram broadly illustrating a second embodiment of the invention. As with the first embodiment illustrated in FIGS. 2–4, the overall purpose of circuit 150 is to receive a digital data stream on line 12 at any data rate within a predetermined working range of the system, increase the sampling rate of the data stream and then decimate this higher rate data stream so that the data stream presented on line 14 is at a fixed, predetermined data rate. The second embodiment uses variable interpolation followed by fixed decimation. DAC 28 in FIG. 8 may be the same as that illustrated in FIGS. 2–4.

Figure 9:
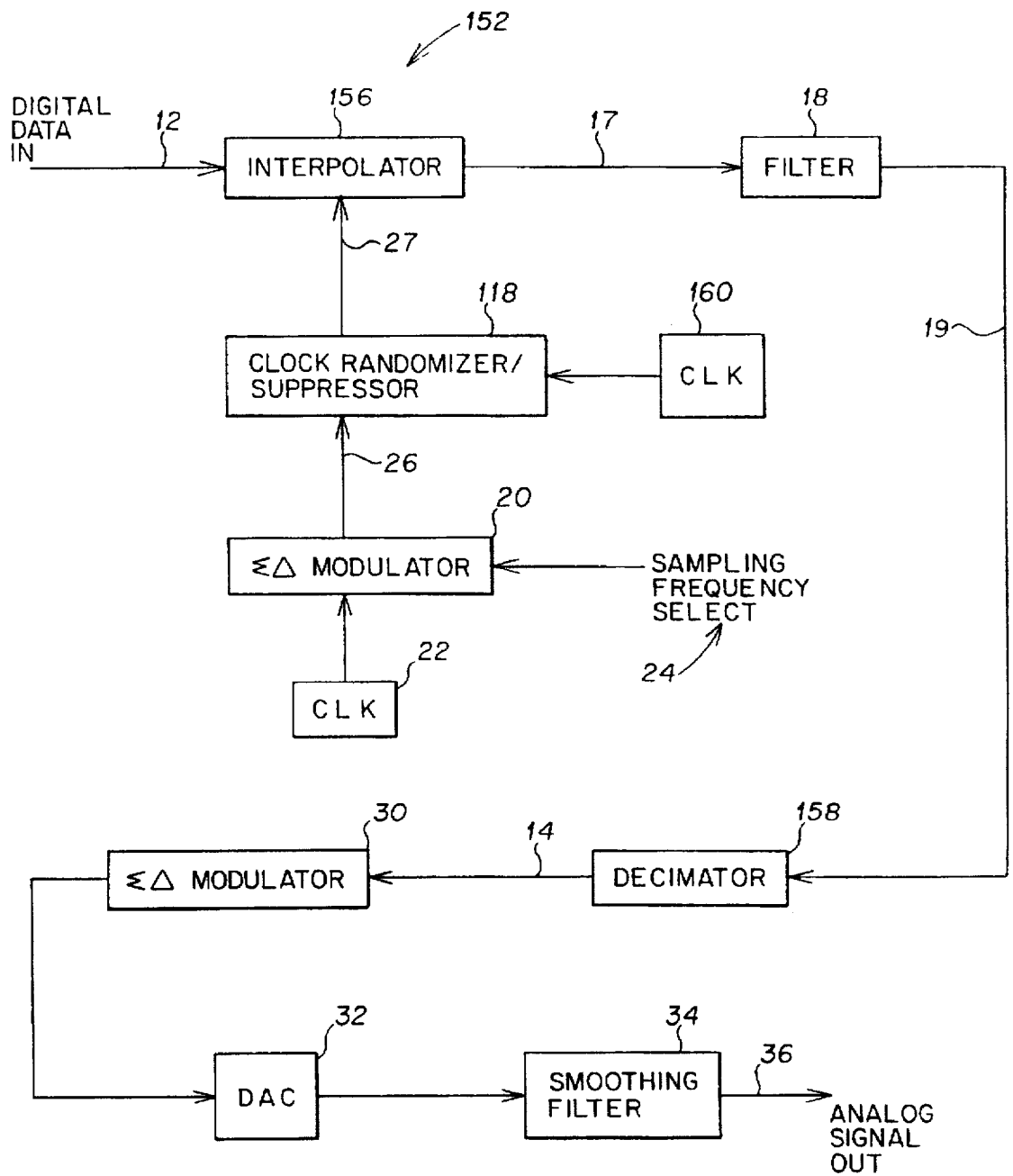
FIG. 9 is a block diagram of a sigma-delta DAC circuit incorporating the second embodiment of the invention.
Figure 10:
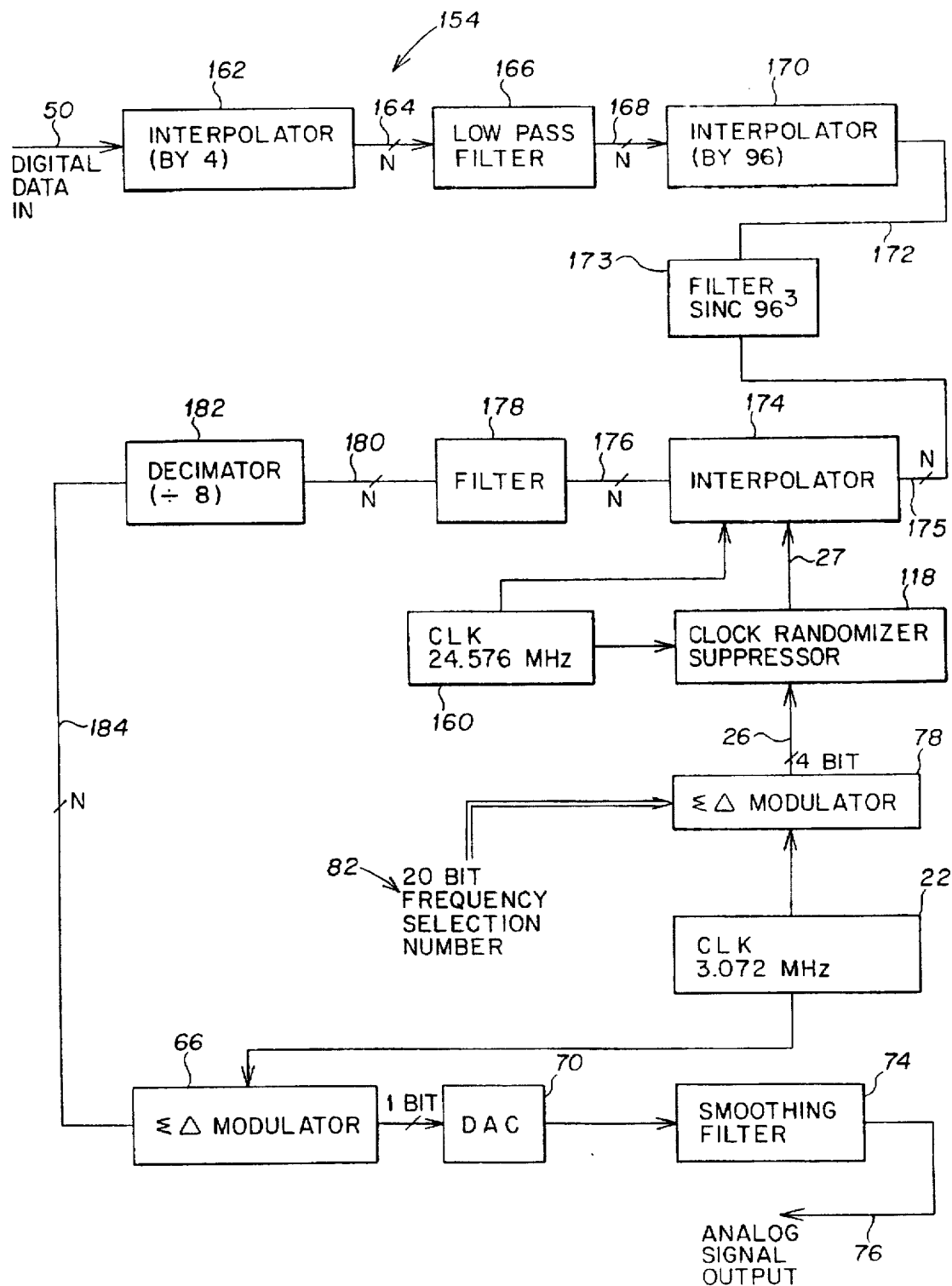
FIG. 10 is a more detailed block diagram of the circuit of FIG. 9.

FIG. 8 illustrates the second embodiment of the invention generally as used with any type of digital-to-analog converter 28. FIGS. 9 and 10 illustrate the second embodiment of the invention used in conjunction with sigma-delta digital-to-analog conversion. One skilled in the art will appreciate that, in FIGS. 9 and 10, both the magnitude and the time base has been encoded in a sigma-delta format.

As illustrated in FIGS. 8 and 9, the digital data on line 12 is interpolated by interpolator 156 under control of clock randomizer/suppressor circuit 118 which is in turn controlled by sigma-delta modulator 20 to produce a higher sample rate digital signal on line 17. Interpolator 156 increases the sample rate of the digital data stream (that is, converts the digital data stream into a higher sample rate digital data stream) on line 17 by using a sample and hold technique that repeats the digital sample for a specified number of clock cycles in a manner well-known to those skilled in the art. One skilled in the art will appreciate that other techniques may be used for increasing the sample rate of the data stream on line 12, such as interpolation techniques that insert zeros between data samples. The purpose of interpolator 156 is to increase the sample rate of the digital data stream on line 12 to create a so-called over sampled signal.

The interpolation ratio (i.e., the ratio by which the sample rate of the digital data on line 12 is increased by interpolator 156 is controlled by clock randomizer/suppressor circuit 118 which is in turn controlled by sigma-delta modulator 20.

The higher sample rate digital data stream on line 17 is then sent to a digital filter 18 which removes any images of the original digital signal as a result of the interpolation process. The filtered digital data stream on line 19 is then sent to a decimation block 158 that decimates the digital data stream on line 28 by a fixed decimation ratio to produce the digital data stream on line 14 having a fixed predetermined data rate. Although filter 18 and decimation block 158 have been illustrated as separate circuit elements for illustrative purposes, one skilled in the art will appreciate that these functions may be performed by a single computation element, such as an FIR or IIR filter in a well known manner. Sigma-delta modulator 20 operates in the same manner as described in connection with the embodiment of FIGS. 2–4.

The m-bit code output signal on line 26 from sigma-delta modulator 20 is fed into the clock randomizer/suppressor circuit 118 that effectively produces an output clock at 384 times greater than the data rate of the digital signal on line 12. In one embodiment, clock 160 is a 24.576 mHz clock. Circuit 118 operates in the same manner as already described in connection with FIG. 6. The following explanation is provided for additional clarification.

Circuit 118 provides a clock on line 26 by suppressing a certain number of clocks from clock 160 in response to the m-bit code on line 26 from sigma-delta modulator 20. If, however, clocks in the same temporal positions are suppressed for each multi-bit code from sigma-delta modulator 20, then unwanted tones may appear in the output data stream on line 27. Therefore, circuit 118 also performs the additional function of randomly suppressing clock cycles in order to prevent unwanted tones in the output data stream on line 27. As described previously, clock suppressor and randomizer circuits are well known in the art. One example of such a circuit may be found in *Phase Locked Loops* by Dr. Roland E. Best, published by McGraw-Hill Book Company, copyright 1984. Clock randomizer/suppressor circuit 118 is needed in the second embodiment to produce a clock on line 27 having a clock frequency that is 384 times the data rate specified by sampling frequency selection signal 24 since sigma-delta modulator 20 is clocked using a fixed clock frequency and a variable clock frequency is needed to variably interpolate the data on line 12. Clock randomizer/suppressor circuit 118 outputs a clock signal on line 27 that controls the interpolation of interpolator 156.

FIG. 10 illustrates a more detailed embodiment 154 of the DAC of FIG. 9. In FIG. 10, the digital data on line 50 is interpolated by a factor of four by interpolator 162. The digital data on line 164 is filtered by low pass filter 166 to remove images of the digital data stream on line 50 that result from the interpolation process. The filtered higher sample rate digital data on line 168 is then sent to interpolator 170 that increases the sample rate by a factor of ninety-six. The higher sample rate digital data on line 172 is then sent to a sinc $96^3$-type filter 173 that removes images of the digital data stream on line 168 that result from the interpolation process. The filtered higher sample rate digital data on line 175 is then sent to interpolator 174 that increases the sample rate by a variable ratio so that the digital data on line 176, after filtering by filter 178 and decimation by a fixed ratio of eight in decimator 182, emerges on line 184 with a sample rate of 3.072 mHz. Filter 178 may be an FIR or IIR filter. The functions of decimator 182 and filter 178 may be combined into a single element as noted in connection with FIGS. 8 and 9.

Sigma-delta modulator 78 produces a four-bit code representative of frequency selection number 82 at a constant rate of 3.072 mHz in response to clock 22. However, interpolator 174 must produce the digital data stream on line 176 having a sample rate of 24.576 mHz so that, when decimated by a factor of eight by decimator 182, the data emerges on line 184 with a sample rate of 3.072 mHz. Therefore, clock randomizer/suppressor circuit 118 is needed to produce a variable rate clock on line 27 to variably interpolate the data on line 175.

Table 1 illustrates the relationship among the four-bit codes that are produced by sigma-delta modulator 78, the number of clocks that are allowed to pass through randomizer/suppressor circuit 118 and the output sample rate that the four-bit code corresponds to when modulator 78 is clocked using a 3.072 mHz clock and when clock randomizer/suppressor circuit 118 and interpolator 174 are clocked using a 24.576 mHz clock. Some examples will illustrate the operation of the second embodiment.

Assume, for purposes of illustration, that the sample rate of the digital data stream on line 50 is 48 kHz. Interpolator 162 increases this sample rate to 192 kHz. Interpolator 170 increases the 192 kHz signal to 18.432 mHz. Twenty-bit frequency selection number 82 is selected such that upon sigma-delta modulation by the fourth order four-bit sigma-delta modulator 78, the four-bit codes generated will be, on average, a +2 code although other four-bit codes will be produced with a lower frequency of occurrence. In accordance with Table 1, the +2 code is processed by clock randomizer/suppressor circuit 118 to allow six out of every eight 24.576 mHz clock cycles from clock 160 to pass through to generate a clock having an average frequency of 18.432 mHz. Interpolator 174 delivers data on line 176 at a rate of 24.576 mHz. Data arrives at the interpolator 174 on line 172 at 18.432 mHz in this example. Each time the 18.432 mHz clock on line 27 is active, a new data point has arrived at the interpolator input on line 172. Interpolator 174 inserts this data point into the outgoing data stream on 176 so that the 18.432 mHz data is delivered at 24.576 mHz on line 176. Interpolator 174 performs this function by sample and holding each 18.432 mHz data point every 24.576 mHz clock until the next 18.432 mHz data point arrives. Alternatively, Interpolator 174 may insert zeros between each data point at 18.432 mHz to deliver the data at 24.576 mHz. The use of a sample and hold technique is advantageous because it automatically compensates for the energy lost in creating the images of the original signal due to the interpolation process. As a result, interpolator 174 increases the sample rate of the digital data stream on line 172 from 18.432 mHz to 24.576 mHz on line 176. Upon filtering by filter 178 and decimation by decimator 182, the digital data emerges on line 184 with a sample rate of, on average, 3.072 mHz.

In another example, assume that the digital data stream on line 50 has a data rate of 4 kHz. Interpolator 162 increases this data rate to 16 kHz. Interpolator 58 increases the 16 kHz data rate to 1.536 mHz. In order that the digital data stream on line 184 have a data rate of 3.072 mHz, the digital data stream on line 60 at 1.536 mHz must be effectively interpolated by a factor of sixteen so that the data rate of the digital data stream on line 176 has a data rate of 24.576 mHz. Therefore, the twenty-bit frequency selection number 82 is chosen such that sigma-delta modulator 78 produces, on average, an equal number of –3 and –4 codes although other four-bit codes will be produced, but with a lower frequency of occurrence. That is, occasionally, –2, –1, and even less frequently, +1, +2 codes will be produced. As shown in Table 1, the –3 code directs circuit 118 to allow one out of every eight 24.576 mHz clocks to pass through (i.e. circuit 118 suppresses seven out of every eight 24.576 mHz clocks in response to a –3 code). The –4 code directs circuit 118 to allow no 24.576 mHz clocks to pass through (i.e. circuit 118 suppresses eight out of every eight 24.576 mHz clocks in response to a –4 code). On average, therefore, one out of every sixteen 24.576 mHz clocks will pass through suppressor circuit 118 in response to an average of –3 and –4 codes.

At the illustrated interpolation ratios and clock frequencies, the –3 code represents a sampling frequency of 8 kHz and the –4 code represents a sampling frequency of DC (i.e. no signal). Therefore, on average of many samples the –3 and –4 four-bit codes represent a sampling frequency of 4 kHz times 384 to provide a clock on line 27 at (384) (4 kHz)=1.536 mHz. In the manner just described in the previous example, interpolator 174 responds to the clock on line 27 to increase the sampling frequency of the 1.536 mHz data on line 172 to 24.576 mHz on line 176.

Figure 12:
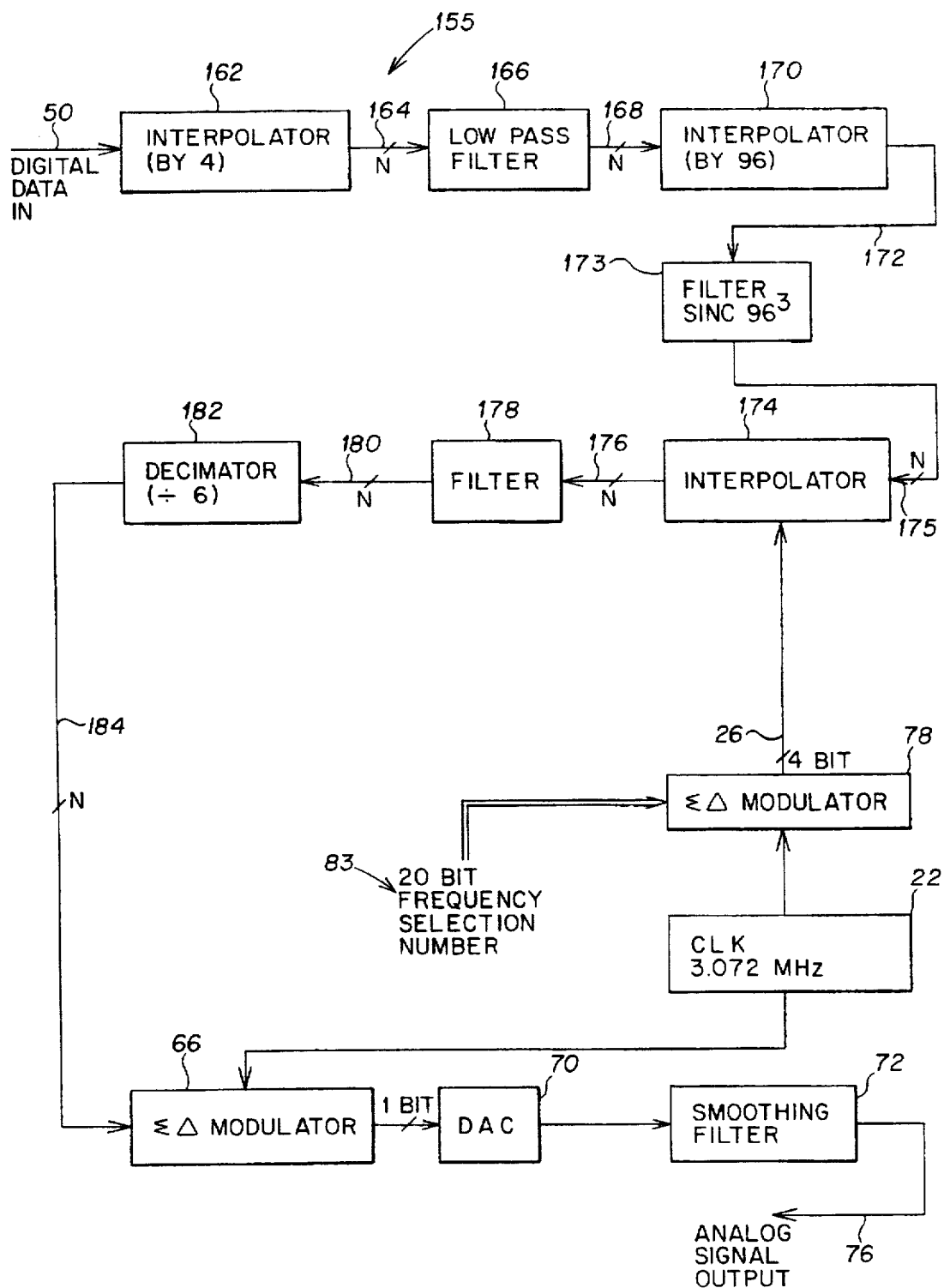
FIG. 12 is a block diagram of a sigma-delta DAC circuit incorporating a third embodiment of the invention.

It is to be noted that digital data streams 164,168, 172, 175, 176, 180, and 184 are indicated as being N-bits wide in FIGS. 10 and 12. N may be any number of bits and is typically chosen to be the widest bit stream commensurate with the signal-to-noise ratio requirements of the particular application.

The embodiment of the invention illustrated in FIGS. 8–10 may be characterized as using variable interpolation followed by fixed decimation. That is, the digital data stream on line 12 or 50 is variably interpolated under control of sigma-delta modulator 20 or 78, respectively, to variably increase the sample rate. This higher sample rate digital signal is then decimated by a fixed ratio to provide the digital data stream on line 14 or 184 at another sample rate.

Figure 11:
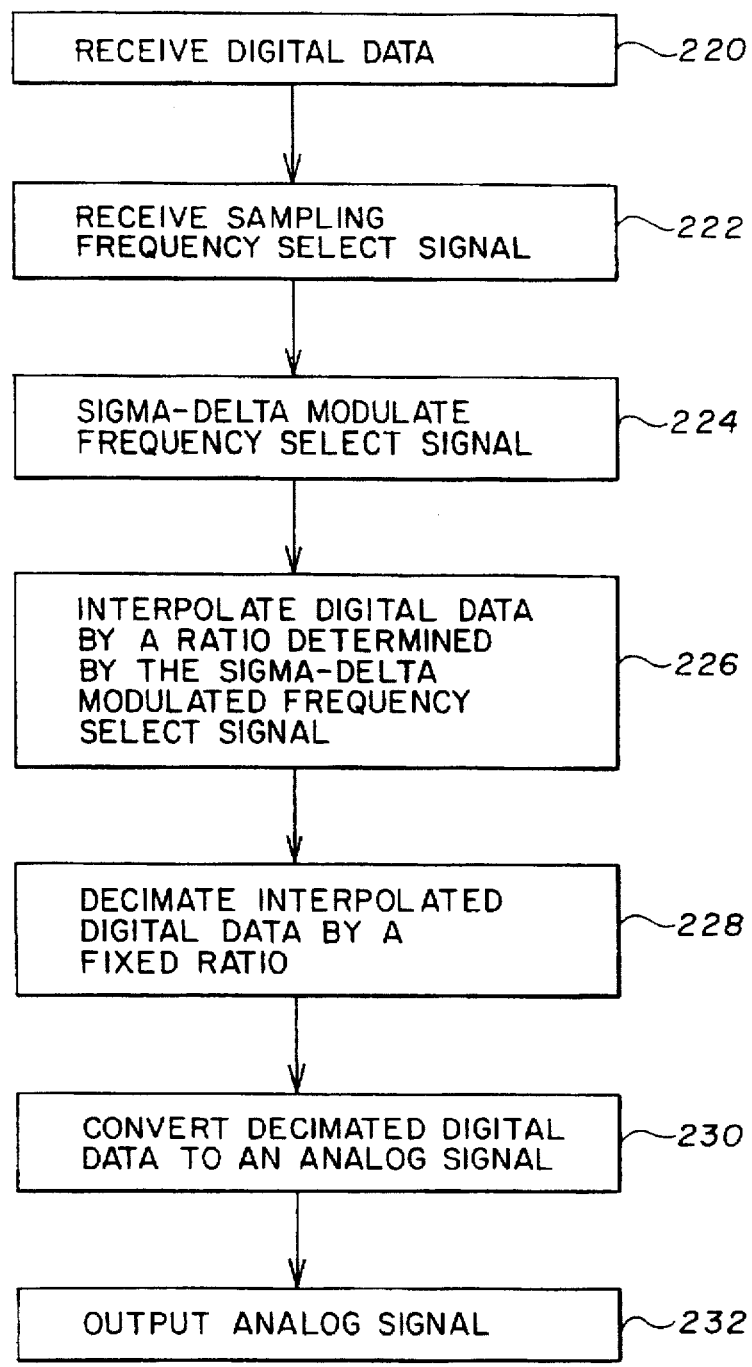
FIG. 11 is a flow chart illustrating the steps of the method of the invention using variable interpolation followed by fixed decimation.

The second embodiment can generate sampling frequencies within the 0 to 64 kHz range by varying the ratio of four-bit codes in the same manner as the first embodiment. The second embodiment provides all of the features and advantages discussed in connection with the first embodiment. The second embodiment can also be used with the circuits illustrated in FIGS. 5 and 6 in the same manner. Reference is now made to FIG. 11 which is a flow chart illustrating a second embodiment of the method of the present invention. FIG. 11 illustrates the method of variable interpolation followed by fixed decimation.

In FIG. 11, the method begins in step 220 in which the input digital data stream is received. From step 220, the method proceeds to step 222 in which the sampling frequency select signal, representative of the sample rate of the digital data received in step 220 is received. From step 222, the method proceeds to step 224 in which the sampling frequency select signal is sigma-delta modulated. From step 224, the method proceeds to step 226 in which the received digital data is interpolated by a ratio determined by the sigma-delta modulated frequency select signal to increase the sample rate of the received digital data. From step 226, the method proceeds to step 228 in which the interpolated digital data is decimated by a fixed ratio. From step 228, the method proceeds to step 230 in which the decimated digital data is converted to an analog signal. From step 230, the method proceeds to step 232 in which the analog signal is output.

Reference is now made to FIG. 12 which figure illustrates a third embodiment of the present invention. In particular, FIG. 12 modifies the circuit of FIG. 10 by eliminating the clock randomizer/suppressor circuit. In all other respects, the components and operation of the circuit of FIG. 12 are the same as those illustrated in FIG. 10. The circuit of FIG. 12 operates in accordance with the method illustrated in FIG. 11, namely, FIG. 12 performs a variable interpolation of the digital data on line 50 followed by a fixed decimation of the interpolated data on line 172 provide digital data at 3.072 mHz on line 184.

Since the clock randomizer/suppressor circuit is eliminated, sigma-delta modulator 78 produces a four-bit code that directly controls the interpolation ratio provided by interpolator 174.

Table 2 illustrates the relationship among the four-bit codes that are produced by sigma-delta modulator 78, the ratio by which the sample rate on line 175 is increased, and the sampling frequency that the four-bit code corresponds to when modulator 78 is clocked using a 3.072 mHz clock. For example, a −4 code controls interpolator 174 to maintain the same sample rate as on line 175 and a +3 code controls interpolator 174 to increase the sample rate on line 175 by a factor of eight. Interpolator 174 operates in the same manner as the interpolators discussed in connection with the first two embodiments.

TABLE 2

| 4 BIT CODE | SAMPLE RATE INCREASE FACTOR | CORRESPONDING TO SAMPLING FREQUENCY OF (kHz) |
|---|---|---|
| +5 | 10 | 4.8 |
| +4 | 9 | 5.333 |
| +3 | 8 | 6 |
| +2 | 7 | 6.857 |
| +1 | 6 | 8 |
| 0 | 5 | 9.6 |
| −1 | 4 | 12 |
| −2 | 3 | 16 |
| −3 | 2 | 24 |
| −4 | 1 | 48 |
| −5 | 0 | ∞ |

Figure 13:
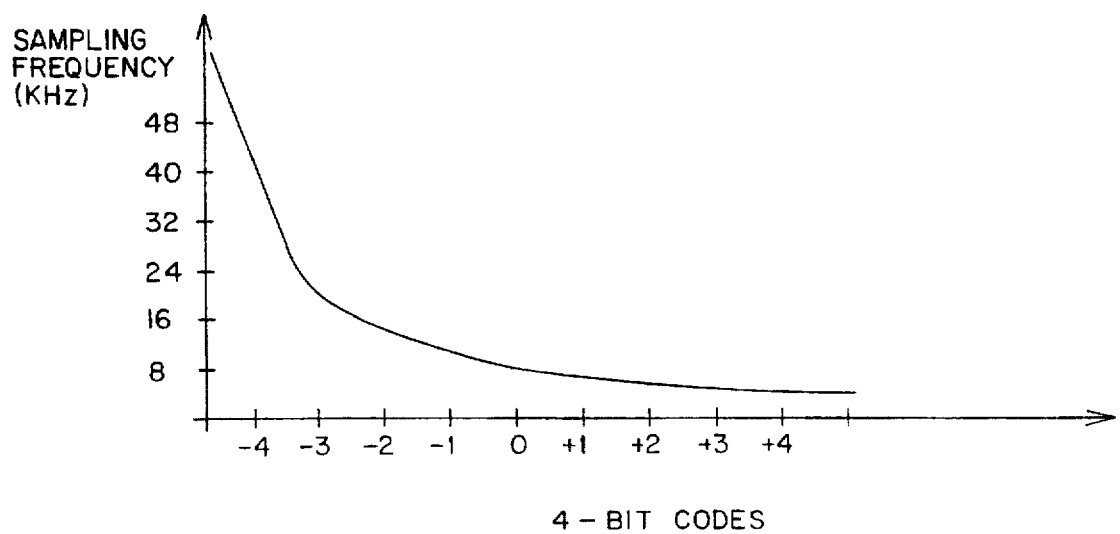
FIG. 13 is a graph illustrating the relationship between the four-bit codes and the corresponding sampling frequency in the circuit of FIG. 12.

FIG. 13 graphically illustrates the 1/n relationship between the four-bit codes and the corresponding sampling frequency. One skilled in the art will appreciate that the system of FIG. 12 is nonlinear in the sense of mapping the four-bit codes to a corresponding sampling frequency only because of the particular interpolation ratios, decimation ratios, and data rates chosen. However, the system itself is linear and, by providing an operation that corrects for the nonlinear mapping of the four-bit codes to the corresponding sampling frequency, a linearly mapped system as in the first two embodiments previously described can be provided. Alternatively, the interpolation ratios, decimation ratios, and data rate may be selected so that there is a linear relationship between four-bit codes and corresponding sampling frequencies. One skilled in the art will also appreciate that the 1/n relationship between four-bit codes and sampling frequency illustrated in FIG. 13 and Table 2 is meant to be exemplary only; other relationships are possible (for all embodiments of the invention) and are to be considered within the scope of the present invention.

The circuit illustrated in FIG. 12 can generate sampling frequencies within the 0 to 64 kHz range by varying the ratio of four-bit codes in the same manner as discussed in conjunction with the first two embodiments. The embodiment illustrated in FIG. 12 can also be used with the circuits illustrated in FIGS. 5 and 6 in the same manner.

Although the mapping between four-bit codes and sampling frequency is nonlinear in the embodiment illustrated in FIG. 12, this embodiment does provide certain advantages. In the embodiment illustrated in FIGS. 8–10, a clock randomizer/suppressor circuit was used. The clock randomizer/suppressor circuit can result in a system having a reduced signal to noise ratio as compared to the embodiments of the invention illustrated in FIGS. 2–4 and 12, since the clock randomizer/suppressor circuit reprocesses the sigma-delta modulated clock signal generated by the sigma-delta modulator and suppresses clock signals in a linear manner. This may degrade the noise shaping provided by the sigma-delta modulator. The circuit illustrated in FIG. 12 is advantageous in that the clock randomizer/suppressor circuit is eliminated and the circuit can still provide a variable interpolation followed by fixed decimation method of operation. Thus, the circuit of FIG. 12 can provide variable interpolation followed by fixed decimation with no degradation in the signal to noise ratio.

Another significant advantage of the all embodiments of present invention is that the DAC does not have to be capable of interpolating the input digital data rate up to the lowest common frequency between the incoming digital data rate and the modulator clock frequency. This is due to the sigma-delta modulation of the sampling intervals. Unlike prior art DACs, the sampling interval does not have to correspond exactly to a fixed relationship between the incoming digital data rate and the modulator clock. Since the sampling rate is sigma-delta encoded in the present invention (i.e. temporally noise-shaped), the sampling rate, on average, will represent the desired sampling rate with the noise or jitter on the sampling points being pushed into the higher frequency ranges. The present invention thus takes advantage of sigma-delta encoding of the time base to avoid the need for interpolation to very high frequencies, which in the prior art, typically were in the gigahertz range. An additional benefit of this process is that on an integrated circuit, a significant savings in chip area can be realized by the use of lower interpolation ratios.

Another important advantage of the present invention is that the sigma-delta modulator 20 or 78 used to control decimation or interpolation can be clocked using a fixed clock frequency, allowing optimization of the modulator operation at the fixed clock frequency.

Finally, by appropriate combination of sigma-delta control codes in appropriate percentages, an infinite number of sample rates can be provided. These sample rates do not need to have any integer or rational relationship with the master clock used to run the DAC.

Although interpolation has been used herein to explain the method (and an interpolator as the apparatus) by which the input digital data stream is converted into a higher sample rate digital data stream, the present invention is not so limited. Any method or apparatus that converts the input digital data stream into a higher sample rate digital data stream may be used to practice the invention.

Interpolators and decimators useful in the present invention may be constructed as shown in Introduction to *Digital Signal Processing* by John Proakis and Dimitris Manolakis, published by Macmillan Publishing Company, ©1988.

Having thus described several particular embodiments of the invention, various alterations, modifications, and improvements will readily occur to those skilled in the art. For example, the present invention can be used in conjunction with any type of DAC or digital to analog conversion method and is not limited to sigma-delta DACs. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A digital to analog converter system, comprising:
   interpolation means for receiving a digital signal having a first data rate and for supplying a digital signal having an increased data rate;
   decimation means, coupled to the interpolation means, for decimating the digital signal having the increased data rate to provide a digital signal having a second data rate;
   modulator means, coupled to and controlling the interpolation means, for providing a modulated output signal representative of the first data rate and for controlling the interpolation means to provide the digital signal having the increased data rate;
   digital to analog conversion means, coupled to and receiving the digital signal having the second data rate from the decimation means, for converting the digital signal having the second data rate to an analog signal.

2. The digital to analog converter system of claim 1, wherein the modulator means comprises a sigma-delta modulator.

3. The digital to analog converter system of claim 2, wherein the modulated output signal is a multi-bit code.

4. The digital to analog converter system of claim 2, wherein the sigma-delta modulator is an $n^{th}$- order modulator wherein $n \geq 1$.

5. The digital to analog converter system of claim 2, wherein the sigma-delta modulator modulates a sampling frequency select signal representative of the first data rate.

6. The digital to analog converter system of claim 5, further comprising a memory means for storing a plurality of frequency selection numbers representative of a first data rate and means for selecting one of the frequency selection numbers in response to a selection signal and for providing the selected number to a sigma-delta modulator as the sampling frequency select signal.

7. The digital to analog converter system of claim 5, wherein the interpolation means interpolates the digital signal having the first data rate by a ratio determined by the sampling frequency select signal to provide the digital signal having the increased data rate.

8. The digital to analog converter system of claim 7, wherein the decimation means decimates the digital signal having a increased data rate by a fixed ratio.

9. The digital to analog converter system of claim 5, further comprising a clock generator means for generating, in response to the modulated output signal, a clock having a frequency representative of the first data rate.

10. The digital to analog converter system of claim 1, further comprising a filter means, coupled between the interpolation means and decimation means, for filtering out noise and images of the digital signal having a first data rate.

11. The digital to analog converter system of claim 2, further comprising:
    phase locked loop means, coupled to the sigma-delta modulator means, for receiving a signal representative of the first data rate, locking to the signal, and providing a control signal to the sigma-delta modulator means that controls the sigma-delta modulator means to provide the sigma-delta modulated output signal.

12. The digital to analog converter system of claim 1, wherein the digital to analog converter is a sigma-delta digital to analog converter.

13. A digital to analog converter system, comprising:
    an interpolator;
    a decimator having an input electrically coupled to an output of the interpolator;
    a modulator electrically coupled to a control input of the interpolator and providing a temporally noise-shaped control signal that controls an interpolation ratio provided by the interpolator; and
    a digital to analog converter having an input electrically coupled to an output of the decimator.

14. The digital to analog converter system of claim 13, wherein the digital to analog converter is a sigma-delta digital to analog converter.

15. A method of converting a digital signal to an analog signal, comprising the steps of:
    receiving a digital signal having a first data rate;
    modulating a control signal to provide a modulated output signal representative of the first data rate;
    increasing the first data rate to provide a digital signal having an increased data rate in response to the modulated output signal;
    decimating the digital signal having the increased data rate to provide a digital signal having a second data rate; and
    converting the digital signal having the second data rate to an analog signal.

16. The method of claim 15, wherein the step of modulating a control signal further comprises sigma-delta modulating the control signal.

17. The method of claim 16, further comprising the step of filtering the digital signal having the increased data rate prior to step of decimating.

18. The method of claim 17, wherein the step of increasing the first data rate includes increasing the first data rate by a ratio determined by the modulated output signal.

19. The method of claim 18, wherein the step of decimating the digital signal having the increased data rate includes decimating the digital signal having the increased data rate by a fixed ratio.

20. The method of claim 15, wherein the step of converting the digital signal to an analog signal includes the step of sigma-delta modulating a magnitude of the digital signal having the second data rate.

21. A method of converting a digital to an analog signal, comprising the steps of:
    receiving a digital signal having a first data rate;
    increasing the first data rate by variable ratio in response to a modulated control signal to provide a temporally noise-shaped digital signal having an increased data rate;
    decimating the noise-shaped digital signal having the increased data rate by a fixed ratio to provide a digital signal having a second data rate; and
    converting the digital signal having the second data rate to an analog signal.

22. The method of claim 21, wherein the step of converting the digital signal to an analog signal includes the step of sigma-delta modulating a magnitude of the digital signal having the second data rate.

* * * * *

UNITED STATES PATENT AND TRADEMARK OFFICE
CERTIFICATE OF CORRECTION

PATENT NO. : 5,712,635
DATED : January 27, 1998
INVENTOR(S) : James Wilson, Ronald A. Cellini and James M. Sobol It is certified that error appears in the above-identified patent and that said Letters Patent is hereby corrected as shown below:

Title page, item [73], Assignee: should read --Analog Devices, Inc., One Technology Way, Norwood, Massachusetts 02062--.

Signed and Sealed this

Second Day of June, 1998

*Attest:*

BRUCE LEHMAN

*Attesting Officer*     Commissioner of Patents and Trademarks